(12) United States Patent
Yang et al.

(10) Patent No.: US 10,043,679 B2
(45) Date of Patent: Aug. 7, 2018

(54) METHOD OF FABRICATING ARRAY SUBSTRATE

(71) Applicant: LG DISPLAY CO., LTD., Seoul (KR)

(72) Inventors: Hee-Jung Yang, Yangju-si (KR);
Hyung-Tae Kim, Goyang-si (KR);
Jae-Young Jeong, Goyang-si (KR);
Gyu-Won Han, Yeoju-gun (KR);
Dong-Sun Kim, Goyang-si (KR);
Won-Joon Ho, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/464,548

(22) Filed: Mar. 21, 2017

(65) Prior Publication Data
US 2017/0194168 A1 Jul. 6, 2017

Related U.S. Application Data

(62) Division of application No. 15/040,605, filed on Feb. 10, 2016, now Pat. No. 9,640,567, which is a division
(Continued)

(30) Foreign Application Priority Data

Oct. 31, 2012 (KR) ........................ 10-2012-0121814

(51) Int. Cl.
*H01L 21/428* (2006.01)
*H01L 29/66* (2006.01)
(Continued)

(52) U.S. Cl.
CPC ........ *H01L 21/428* (2013.01); *H01L 21/4757* (2013.01); *H01L 27/1225* (2013.01);
(Continued)

(58) Field of Classification Search
None
See application file for complete search history.

(56) References Cited

U.S. PATENT DOCUMENTS 7,910,490 B2 * 3/2011 Akimoto ............. H01L 27/1225
438/104
2006/0220141 A1 10/2006 Besser
(Continued)

FOREIGN PATENT DOCUMENTS

| CN | 101740636 A | 6/2010 |
| CN | 102208452 A | 10/2011 |
| WO | WO 2012/044344 A1 | 4/2012 |

OTHER PUBLICATIONS

Arai et al., "Highly Reliable Oxide-Semiconductor TFT for AM-OLED Display," SID 10 Digest, 2010, pp. 1033-1036.

*Primary Examiner* — Michelle Mandala
(74) *Attorney, Agent, or Firm* — Birch, Stewart, Kolasch & Birch, LLP

(57) ABSTRACT

A method of fabricating an array substrate including forming an oxide semiconductor layer on a substrate; sequentially forming a gate insulating layer and a gate electrode corresponding to a central portion of the oxide semiconductor layer; forming source and drain areas having conductive properties in the oxide semiconductor layer by irradiating X-rays or UV rays to the oxide semiconductor layer exposed outside the gate electrode; forming an inter insulating layer on the gate electrode and having first contact holes that expose the source and drain areas; and forming source and drain electrodes on the inter insulating layer and contacting the source and drain areas through the first contact holes, respectively.

4 Claims, 14 Drawing Sheets

Related U.S. Application Data of application No. 14/061,563, filed on Oct. 23, 2013, now Pat. No. 9,293,478.

(51) Int. Cl.
*H01L 27/12* (2006.01)
*H01L 29/786* (2006.01)
*H01L 29/08* (2006.01)
*H01L 21/4757* (2006.01)

(52) U.S. Cl.
CPC .... *H01L 29/0847* (2013.01); *H01L 29/66969* (2013.01); *H01L 29/7869* (2013.01)

(56) References Cited

U.S. PATENT DOCUMENTS

| | | |
|---|---|---|
| 2007/0054507 A1* | 3/2007 | Kaji ............... H01L 21/02554 438/795 |
| 2007/0252145 A1 | 11/2007 | Toyota et al. |
| 2008/0303020 A1 | 12/2008 | Shin et al. |
| 2009/0057674 A1 | 3/2009 | Jeong et al. |
| 2009/0065771 A1 | 3/2009 | Iwasaki et al. |
| 2009/0072309 A1 | 3/2009 | Nakajima |
| 2009/0230890 A1* | 9/2009 | Takahara ............ G09G 3/3233 315/307 |
| 2010/0117075 A1 | 5/2010 | Akimoto et al. |
| 2010/0123131 A1 | 5/2010 | Tokunaga |
| 2010/0308326 A1 | 12/2010 | Kim et al. |
| 2011/0240998 A1 | 10/2011 | Morosawa et al. |
| 2012/0258575 A1 | 10/2012 | Sato et al. |
| 2012/0319113 A1 | 12/2012 | Yamazaki |

* cited by examiner

METHOD OF FABRICATING ARRAY SUBSTRATE

CROSS-REFERENCE TO RELATED APPLICATIONS

This application is a Divisional of co-pending U.S. patent application Ser. No. 15/040,605, filed Feb. 10, 2016, which is a Division of U.S. patent application Ser. No. 14/061,563 (now U.S. Pat. No. 9,293,478), filed on Oct. 23, 2013, which claims priority under 35 U.S.C. § 119(a) to Application No. 10-2012-0121814, filed in Republic of Korea on Oct. 31, 2012, all of which are hereby expressly incorporated by reference into the present application.

BACKGROUND OF THE INVENTION

Field of the Invention

The present invention relates to an array substrate, and more particularly, to a method of fabricating an array substrate which includes a thin film transistor with an oxide semiconductor layer.

Discussion of the Related Art

With rapid development of information technologies, display devices for displaying a large amount of information have been promptly developed. More particularly, flat panel display (FPD) devices having a thin profile, light weight and low power consumption such as organic electroluminescent display (OLED) devices and liquid crystal display (LCD) devices have been actively pursued and are replacing the cathode ray tubes (CRTs).

Among the liquid crystal display devices, active matrix type liquid crystal display devices, which include thin film transistors to control on/off the respective pixels, have been widely used because of their high resolution, color rendering capability and superiority in displaying moving images.

In addition, organic electroluminescent display devices have been recently spotlighted because they have many merits as follows: the organic electroluminescent display devices have high brightness and low driving voltages; because they are self-luminous, the organic electroluminescent display devices have excellent contrast ratios and ultra thin thicknesses; the organic electroluminescent display devices have a response time of several micro seconds, and there are advantages in displaying moving images; the organic electroluminescent display devices have wide viewing angles and are stable under low temperatures; since the organic electroluminescent display devices are driven by a low voltage of direct current (DC) 5V to 15V, it is easy to design and manufacture driving circuits; and the manufacturing processes of the organic electroluminescent display device are simple since only deposition and encapsulation steps are required. In the organic electroluminescent display devices, active matrix type display devices also have been widely used because of their low power consumption, high definition and large-sized possibility.

Each of the active matrix type liquid crystal display devices and the active matrix type organic electroluminescent display devices includes an array substrate having thin film transistors as switching elements to control on/off their respective pixels.

FIG. 1 is a cross-sectional view of illustrating an array substrate for a liquid crystal display device according to the related art. FIG. 1 shows a cross-section of a pixel region including a thin film transistor in the array substrate.

In FIG. 1, a gate line (not shown) and a data line (not shown) are formed on a substrate 11 and cross each other to define a pixel region P. A gate electrode 15 is formed at a switching region TrA of the pixel region P.

A gate insulating layer 18 is formed on the gate electrode 15, and a semiconductor layer 28, which includes an active layer 22 of intrinsic amorphous silicon and ohmic contact layers 26 of impurity-doped amorphous silicon, is formed on the gate insulating layer 18.

Source and drain electrodes 36 and 38 are formed on the ohmic contact layers 26. The source and drain electrodes 36 and 38 correspond to the gate electrode 15 and are spaced apart from each other. The gate electrode 15, the gate insulating layer 18, the semiconductor layer 28, and the source and drain electrodes 36 and 38 sequentially formed at the switching region TrA constitute a thin film transistor Tr.

A passivation layer 42 is formed on the source and drain electrodes 36 and 38 and the exposed active layer 22 all over the substrate 11. The passivation layer 42 has a drain contact hole 45 exposing a portion of the drain electrode 38. A pixel electrode 50 is formed independently in each pixel region P on the passivation layer 42. The pixel electrode 50 contacts the drain electrode 38 through the drain contact hole 45.

Here, although not shown in the figure, a semiconductor pattern is formed under the data line. The semiconductor pattern has a double-layered structure including a first pattern of the same material as the ohmic contact layers 26 and a second pattern of the same material as the active layer 22.

In the semiconductor layer 28 formed at the switching region TrA of the related art array substrate, the active layer 22 of intrinsic amorphous silicon has different thicknesses depending on the position. That is, a portion of the active layer 22 exposed by selectively removing the ohmic contact layers 26 has a first thickness t1 and a portion of the active layer 22 under the ohmic contact layers 26 has a second thickness t2, which is thicker than the first thickness t1. The different thicknesses of the different portions of the active layer 22 result from a manufacturing method, and this decreases the output characteristics of the thin film transistor Tr and negatively affects the performance of the thin film transistor Tr because the active layer 22 between the source and drain electrodes 36 and 38, which becomes a channel of the thin film transistor Tr, has a reduced thickness.

To address this problem, a thin film transistor having an oxide semiconductor layer of a single layer, which does not need the related art ohmic contact layers and which uses an oxide semiconductor material as an active layer, has been introduced.

FIG. 2 is a cross-sectional view of illustrating a pixel region for an array substrate that includes a thin film transistor having such an oxide semiconductor layer according to the related art.

In FIG. 2, an oxide semiconductor layer 63 is formed at each pixel region P on a transparent insulating substrate 61. A gate electrode 69 is formed in correspondence to a central portion of the oxide semiconductor layer 63, and a gate insulating layer 66 is disposed between the oxide semiconductor layer 63 and the gate electrode 69.

At this time, the oxide semiconductor layer 63 includes an active area 63a and source and drain areas 63b. The active area 63a corresponds to the gate electrode 69 and has a semiconducting property. The source and drain areas 63b are exposed at both sides of the gate insulating layer 66 and have conductive properties different from the active area 63a.

An inter insulating layer 72 of an inorganic insulating material is formed on the gate electrode 69 and the gate insulating layer 66. The inter insulating layer 72 includes first and second semiconductor contact holes 74a and 74b, which expose the source and drain areas 63b of the oxide semiconductor layer 63, respectively, at both sides of the gate electrode 69.

Source and drain electrodes 76 and 77 are formed on the inter insulating layer 72. The source and drain electrodes 76 and 77 contact the source and drain areas 63b through the first and second semiconductor contact holes 74a and 74b, respectively.

A passivation layer 78 is formed on the source and drain electrodes 76 and 77, and a pixel electrode 85 is formed on the passivation layer in the pixel region P. The pixel electrode 85 contacts the drain electrode 77 through a drain contact hole 80 of the passivation layer 78.

In the array substrate including the thin film transistor OTr of FIG. 2 having the oxide semiconductor layer 63, the oxide semiconductor layer 63 has a single-layered structure without the ohmic contact layers. Thus, the oxide semiconductor layer 63 is not exposed to etching gases used in a dry-etching process for forming the ohmic contact layers 26 of FIG. 1. Therefore, the output characteristics of the thin film transistor OTr are prevented from being lowered and minimized.

However, in the array substrate including the thin film transistor OTr of FIG. 2 having the oxide semiconductor layer 63, to transmit a signal voltage applied from the source electrode 76 to the drain electrode 77 through the oxide semiconductor layer 63, it is needed to decrease the contact resistance between the oxide semiconductor layer 63 and the source and drain electrodes 76 and 77. Therefore, to increase conductive properties of portions of the oxide semiconductor layer 63 contacting the source and drain electrodes 76 and 77, hydrogen plasma treatment may be performed to the oxide semiconductor layer 63 exposed outside the gate insulating layer 66, as shown in FIG. 3, which is a cross-sectional view of illustrating an array substrate including a thin film transistor having an oxide semiconductor layer in a step of performing hydrogen plasma treatment.

However, even though the source and drain areas 63b of the oxide semiconductor layer 63 is treated by hydrogen plasma, the source and drain areas 63b of the oxide semiconductor layer 63 contacting the source and drain electrodes 76 and 77 gradually lose the conductive properties as time passes, and the characteristics of the oxide thin film transistor are lowered.

SUMMARY OF THE INVENTION

Accordingly, the present invention is directed to an array substrate including an oxide thin film transistor and a method of fabricating the same that substantially obviate one or more of the problems due to limitations and disadvantages of the related art.

An object of the present invention is to provide an array substrate including an oxide thin film transistor and a method of fabricating the same that maintain the conductive properties of the source and drain areas of the oxide semiconductor layer as time passes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabrication an array substrate includes forming an oxide semiconductor layer on a substrate; sequentially forming a gate insulating layer and a gate electrode corresponding to a central portion of the oxide semiconductor layer; forming source and drain areas having conductive properties in the oxide semiconductor layer by performing hydrogen plasma treatment; forming barrier layers on the source and drain areas, the barrier layer having a first thickness; forming an inter insulating layer on the gate electrode and having first contact holes that expose the barrier layers; and forming source and drain electrodes on the inter insulating layer and contacting the barrier layers through the first contact holes, respectively.

In another aspect, a method of fabrication an array substrate includes forming an oxide semiconductor layer on a substrate; forming a gate insulating layer corresponding to a central portion of the oxide semiconductor layer; forming a first reactive metallic pattern and second reactive metallic patterns on the gate insulating layer and portions of the oxide semiconductor layer exposed outside the gate insulating layer, respectively; forming a gate electrode on the first reactive metallic pattern; forming source and drain areas having conductive properties in the oxide semiconductor layer by performing heat treatment such that materials of the second reactive metallic patterns are diffused into the oxide semiconductor layer contacting the second reactive metallic patterns; forming an inter insulating layer on the gate electrode and having first contact holes that expose the second reactive metallic patterns; and forming source and drain electrodes on the inter insulating layer and contacting the second reactive metallic patterns through the first contact holes, respectively.

In another aspect, a method of fabricating an array substrate includes forming an oxide semiconductor layer on a substrate; sequentially forming a gate insulating layer and a gate electrode corresponding to a central portion of the oxide semiconductor layer; forming source and drain areas having conductive properties in the oxide semiconductor layer by irradiating X-rays or UV rays to the oxide semiconductor layer exposed outside the gate electrode; forming an inter insulating layer on the gate electrode and having first contact holes that expose the source and drain areas; and forming source and drain electrodes on the inter insulating layer and contacting the source and drain areas through the first contact holes, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Reference will now be made in detail to embodiments of the present invention, examples of which are illustrated in the accompanying drawings. Wherever possible, similar reference numbers will be used to refer to the same or similar parts.

FIGS. 4A to 4H are cross-sectional views of illustrating an array substrate in steps of a method of fabricating the same according to a first embodiment of the invention and show a pixel region including an oxide thin film transistor as a switching element. For convenience of explanation, a region where the oxide thin film transistor is located is defined as a switching region TrA in each pixel region P.

Figure 1:
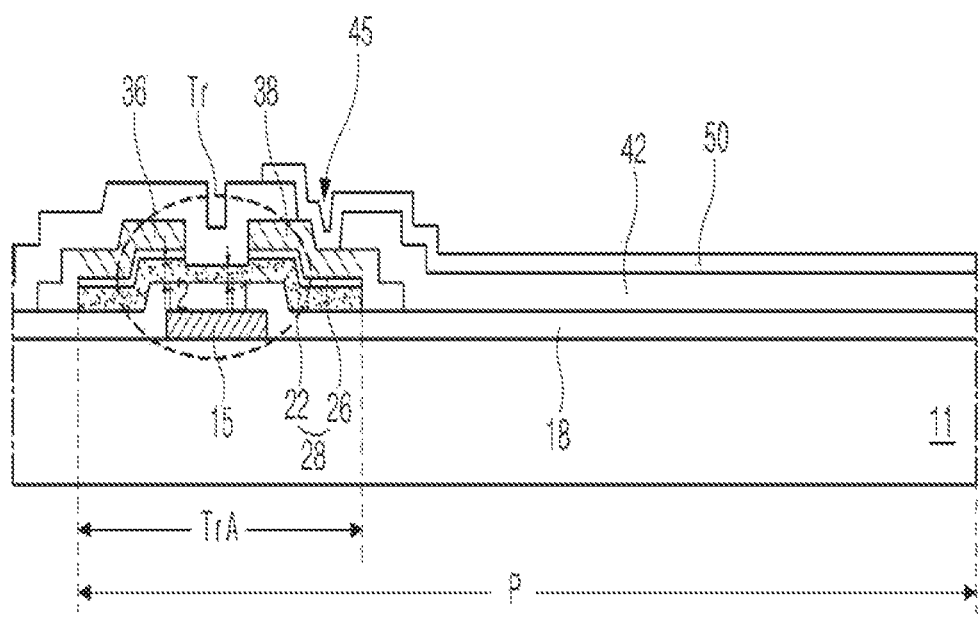
FIG. 1 is a cross-sectional view of illustrating an array substrate for a liquid crystal display device according to the related art.
Figure 2:
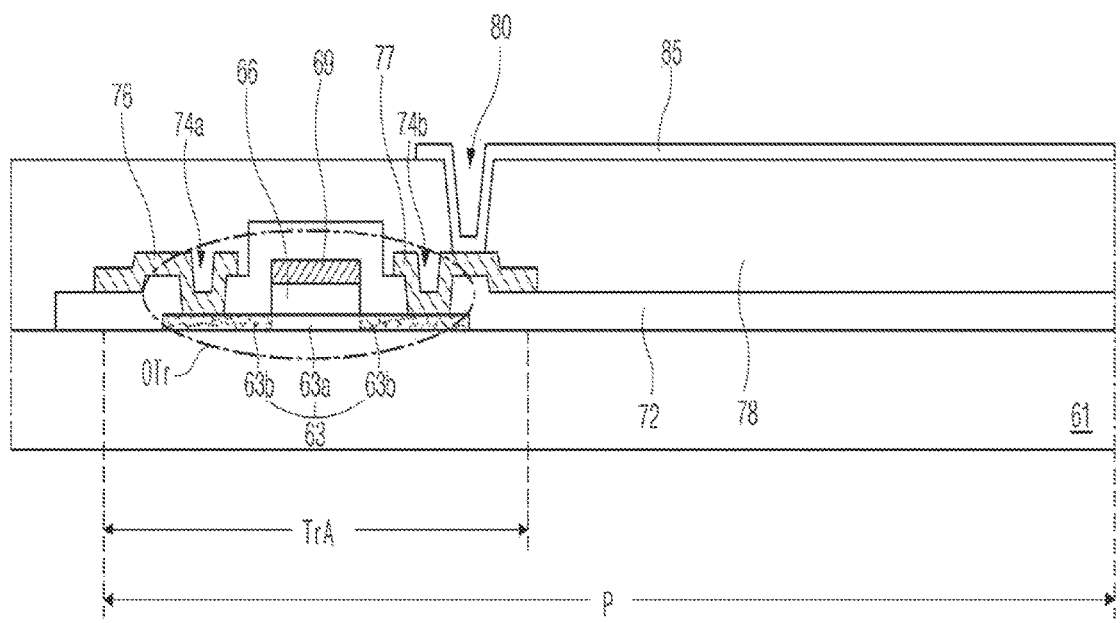
FIG. 2 is a cross-sectional view of illustrating a pixel region for an array substrate that includes a thin film transistor having such an oxide semiconductor layer according to the related art.
Figure 3:
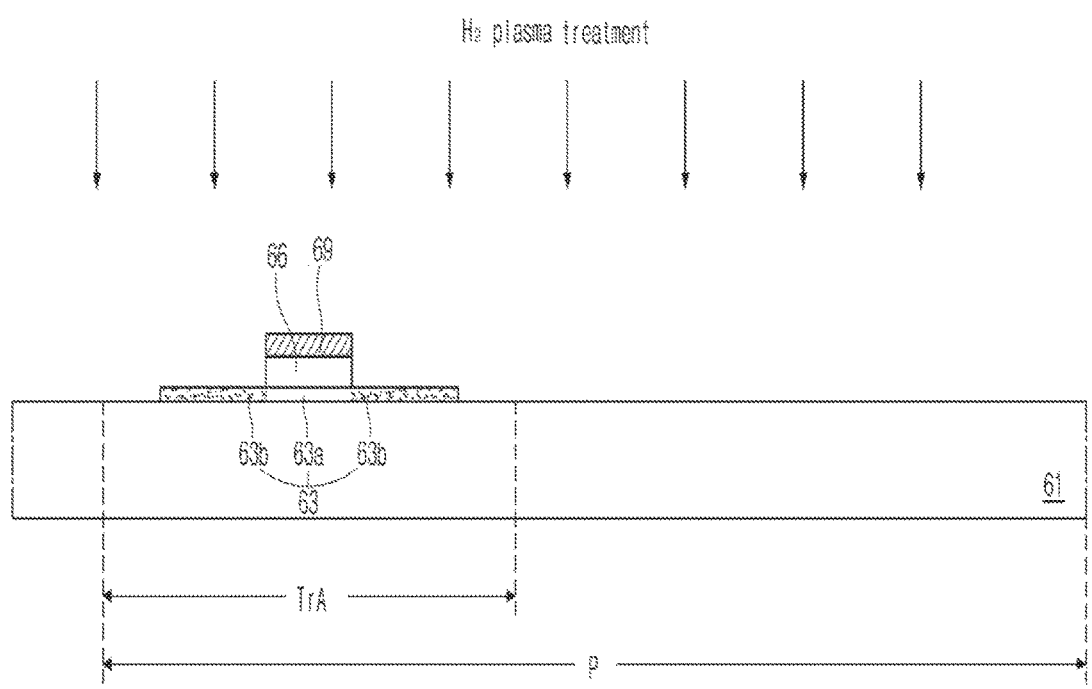
FIG. 3 is a cross-sectional view of illustrating an array substrate including a thin film transistor having an oxide semiconductor layer in a step of performing hydrogen plasma treatment.
Figure 4A:
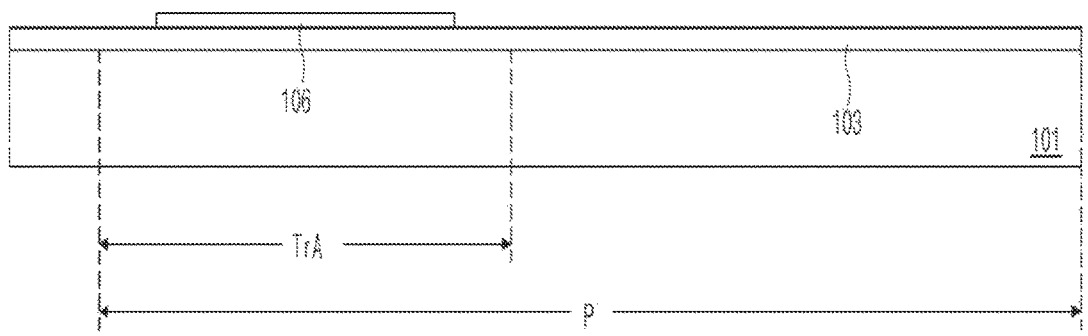
FIGS. 4A to 4H are cross-sectional views of illustrating an array substrate in steps of a method of fabricating the same according to a first embodiment of the invention and show a pixel region including an oxide thin film transistor as a switching element.

In FIG. 4A, a buffer layer 103 is formed on a transparent insulating substrate 101 by depositing an inorganic insulating material. The substrate 101 may include glass or plastic, and the inorganic insulating material may include silicon nitride.

The buffer layer 103 prevents alkali ions such as kalium ions (K+) or natrium ions (Na+) in the substrate 103 of an organic material from flowing out of the substrate 101 and lowering properties of an oxide semiconductor layer when heat is applied during processes of forming elements of a thin film transistor. The buffer layer 103 may be omitted depending on a material of the substrate 101 or temperatures of the processes.

Next, an oxide semiconductor material layer (not shown) is formed on the buffer layer 103 by depositing an oxide semiconductor material over an entire surface of the substrate 101. The oxide semiconductor material may be one of indium gallium zinc oxide (IGZO), zinc tin oxide (ZTO) and zinc indium oxide (ZIO).

Then, an oxide semiconductor layer 106 is formed in the switching region TrA by patterning the oxide semiconductor material layer through a mask process including application of photoresist, light-exposure using a photo mask, development of the photoresist exposed to light, etch using the developed photoresist, and stripping of the photoresist. The oxide semiconductor layer 106 may have an island shape.

Figure 4B:
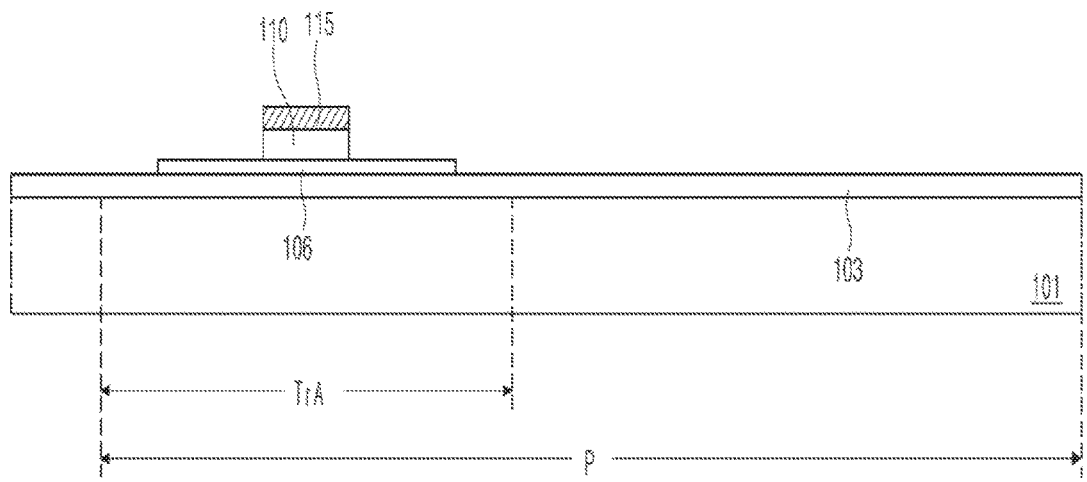

Next, in FIG. 4B, a gate insulating material layer (not shown) is formed on the oxide semiconductor layer 106 by depositing an inorganic insulating material such as silicon oxide ($SiO_2$) or silicon nitride (SiNx) over an entire surface of the substrate 101. Subsequently, a first metallic layer (not shown) is formed on the gate insulating material layer by depositing a metallic material having relatively low resistivity over an entire surface of the substrate 101. The metallic material may include one or more than two selected from aluminum (Al), aluminum alloy such as AlNd, copper (Cu), copper alloy, molybdenum (Mo), and molybdenum alloy such as MoTi.

Then, a gate insulating layer 110 and a gate electrode 115 are sequentially formed in the switching region TrA corresponding to a central portion of the oxide semiconductor layer 106 by patterning the first metallic layer and the gate insulating material layer thereunder through a mask process. Simultaneously, a gate line (not shown) connected to the gate electrode 115 is formed on the buffer layer 103 along a first direction. At this time, the gate insulating layer 110 is also formed under the gate line and has the same shape as the gate line in a plan view.

Figure 4C:
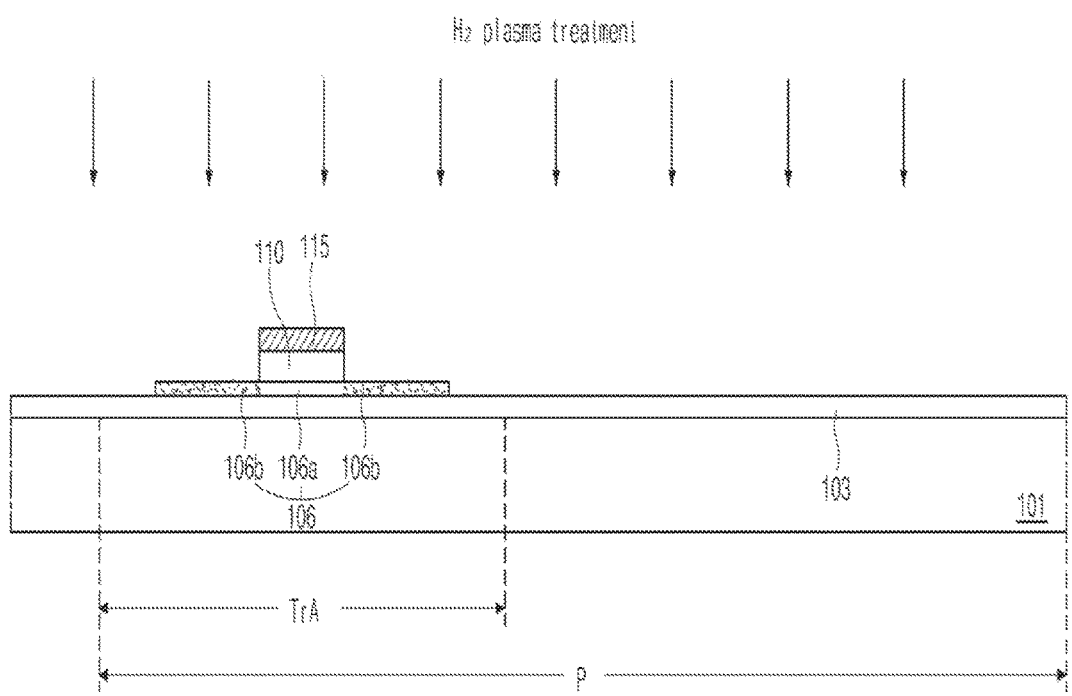

Next, as shown in FIG. 4C, source and drain areas 106b are formed in the oxide semiconductor layer 106 exposed outside the gate electrode 115 by performing a hydrogen plasma process to the substrate 101 including the gate line (not shown) and the gate electrode 115 to give the exposed oxide semiconductor layer 106 conductive properties. Here, a portion of the oxide semiconductor layer 106 under the gate insulating layer 110 and the gate electrode 115 is not exposed to the hydrogen plasma and becomes an active area 106a in which a channel is formed.

Figure 4D:
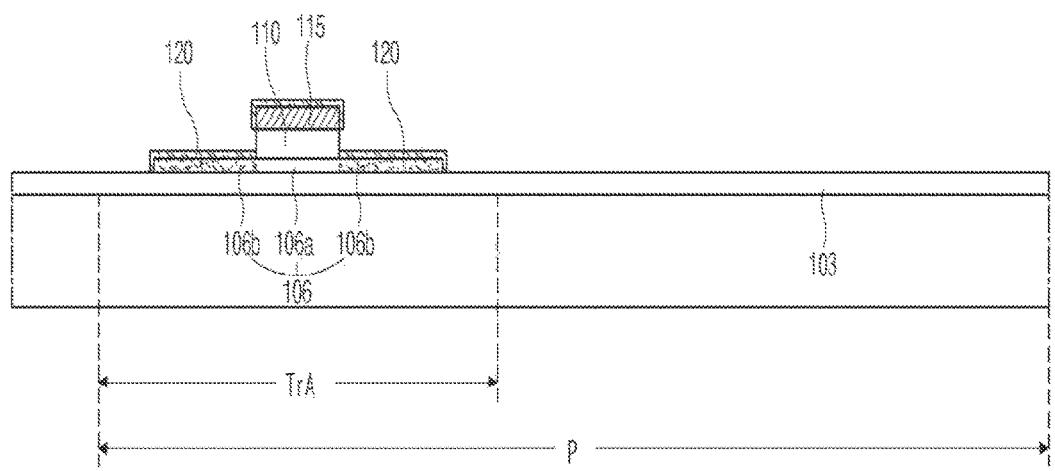

Then, as shown in FIG. 4D, a barrier layer 120 is formed on the gate line (not shown), the gate electrode 115 and the source and drain areas 106b of the oxide semiconductor layer 106 by using one of a plating method, a chemical vapor deposition (CVD) method and an atom layer deposition (ALD) method. The barrier layer 120 may be formed at exposed side and upper surfaces of each of the gate line, the gate electrode 115, and the source and drain areas 106b. The barrier layer 120 may include an metallic material selected from cobalt (Co), nickel (Ni), gold (Au) and silver (Ag), which are seldom oxidized, that is, almost inoxidizable. The barrier layer 120 may have a thickness of several angstroms (A) to dozen angstroms.

Among the methods, the plating method is desirable to selectively form the barrier layer 120 only on a metallic layer and a conductive layer. It is impossible to selectively form a layer only on a metallic layer and a conductive layer using the CVD method and the ALD method such that the layer has a thickness of several hundred angstroms. However, it is possible to selectively form the barrier layer 120 only on the gate line (not shown), the gate electrode 115, and the source and drain areas 106b using the CVD method and the ALD method such that the barrier layer 120 has a thickness of several angstroms to dozen angstroms.

The barrier layer 120, which is formed of the almost inoxidizable metallic material and formed on the source and drain areas 106b, prevents a decrease in the conductive properties of the source and drain areas 106b due to oxygen from an inter insulating layer 125, which will be formed of an inorganic insulating material later. During the hydrogen plasma process, oxygen molecules in the source and drain areas 106b are combined with hydrogen molecules and get out of the oxide semiconductor layer 106, whereby the conductive properties of the source and drain areas 106b are increased. However, if oxygen molecules are supplied to the source and drain areas 106b from elements adjacent to the source and drain areas 106b by diffusion, the source and drain areas 106b tend to turn back to properties of the original oxide semiconductor, and the conductive properties of the source and drain areas 106 are decreased.

Accordingly, to prevent the above-mentioned problem from occurring, the barrier layer 120, which is formed of an almost inoxidizable metallic material, is formed on the source and drain areas 106b of the oxide semiconductor layer 106 by a thickness of several angstroms to dozen angstroms. At this time, since the gate line and the gate electrode 115 have a conductive property, the barrier layer 120 is also formed on the gate line and the gate electrode 115 when a metallic material for the barrier layer 120 is selectively deposited on the source and drain areas 106b by the CVD method and the ALD method.

The barrier layer 120 on the gate electrode 115 is separated from the barrier layer 120 on the source and drain areas 106b of the oxide semiconductor layer 106 by side surfaces of the gate insulating layer 110.

The barrier layer 120 may be formed on the source and drain areas 106b of the oxide semiconductor layer 106 by depositing an almost inoxidizable metallic material over an entire surface of the substrate 101 and selectively patterning the metallic material. This needs an additional mask process to pattern the metallic material.

On the other hand, the barrier layer 120 may be selectively formed on the source and drain areas 106b, the gate line and the gate electrode 115 by the plating method, the CVD method or the ALD method without an additional mask process.

Figure 4E:
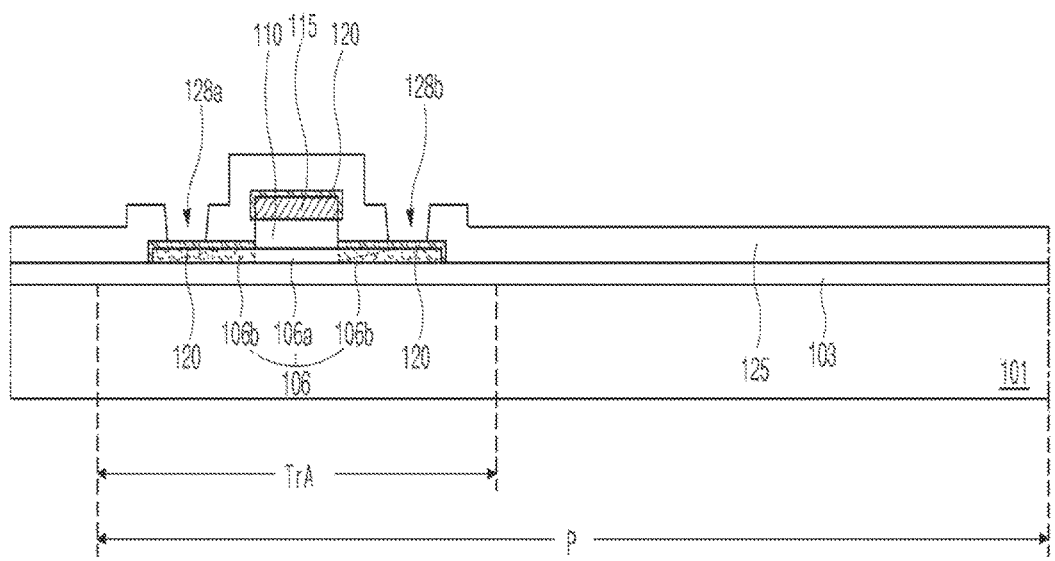

In FIG. 4E, an inter insulating layer 125 is formed on the barrier layer 120 on each of the gate line (not shown), the gate electrode 115 and the source and drain areas 106b of the oxide semiconductor layer 106 by depositing an inorganic insulating material such as silicon oxide or silicon nitride over an entire surface of the substrate 101.

Then, the inter insulating layer 125 is patterned through a mask process, thereby forming first and second semiconductor contact holes 128a and 128b. The first and second semiconductor contact holes 128a and 128b expose the source and drain areas 106b of the oxide semiconductor layer 106 disposed at both sides of the gate electrode 115 in the switching region TrA, respectively.

Figure 4F:
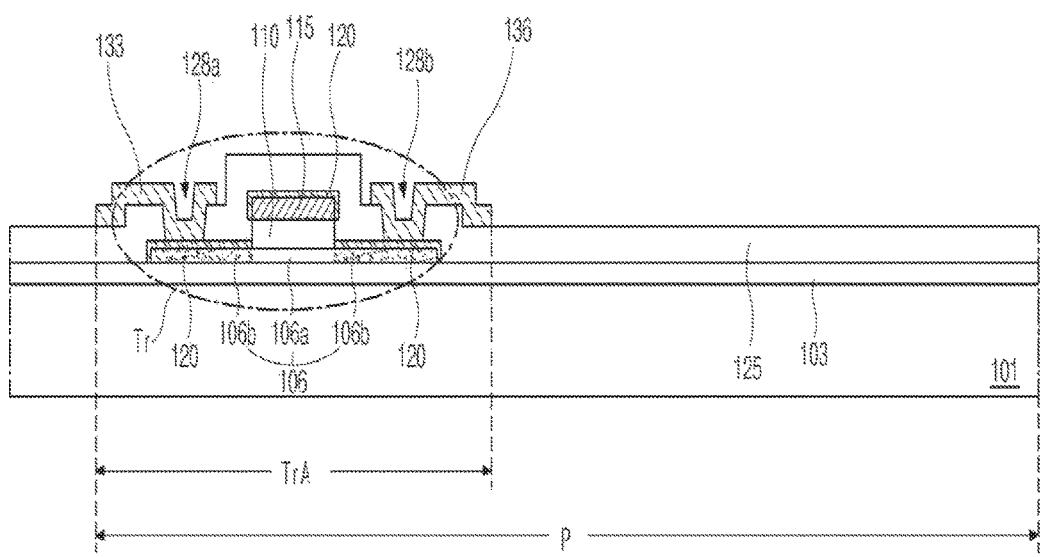

Next, in FIG. 4F, a second metallic layer (not shown) is formed on the inter insulating layer 125 having the first and second semiconductor contact holes 128a and 128b by depositing a second metallic material having relatively low resistivity. The second metallic material may be one or more selected from copper (Cu), copper alloy, aluminum (Al), aluminum alloy such as aluminum neodymium (AlNd), molybdenum (Mo) and molybdenum alloy such as molybdenum titanium (MoTi). The second metallic layer may have a single-layered structure or a multi-layered structure.

Then, the second metallic layer is patterned through a mask process, thereby forming source and drain electrodes 133 and 136 and a data line (not shown) on the inter insulating layer 120. The source electrode 133 and the drain electrode 136 are disposed in the switching region TrA and spaced apart from each other. The source electrode 133 and the drain electrode 136 contact the barrier layer 120 on the source and drain areas 106b of the oxide semiconductor layer 106 through the first and second semiconductor contact holes 128a and 128b, respectively. The data line extends along a second direction and crosses the gate line (not shown) to define the pixel region P. The data line is connected to the source electrode 133.

Figure 4G:
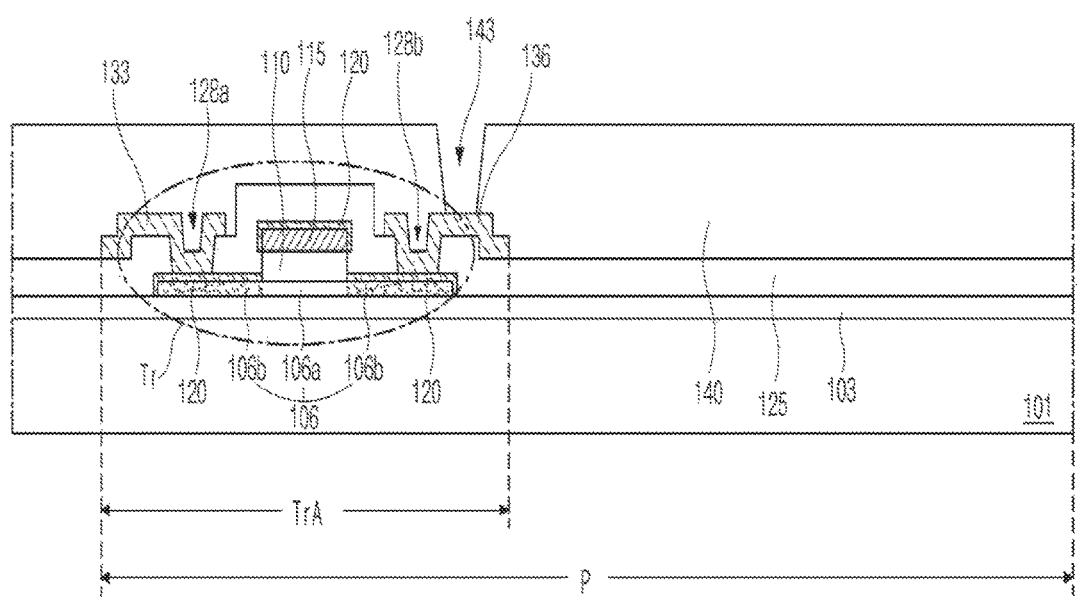

Next, as shown in FIG. 4G, a passivation layer 140 is formed on the source and drain electrodes 133 and 136 and the data line (not shown) by depositing an inorganic insulating material or applying an organic insulating material over a substantially entire surface of the substrate 101. For example, the inorganic insulating material may be silicon oxide or silicon nitride, and the organic insulating material may be benzocyclobutene (BCB) or photo acryl.

The passivation layer 140 is patterned through a mask process, thereby forming a drain contact hole 143 exposing the drain electrode 136 in the switching region TrA.

Figure 4H:
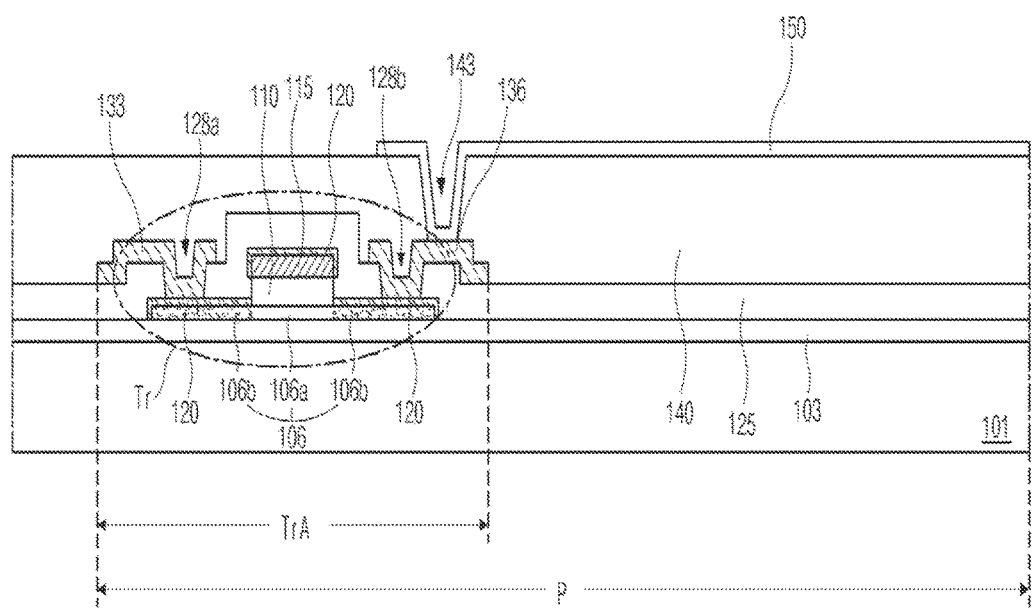

Next, in FIG. 4H, a pixel electrode 150 is formed at each pixel region P on the passivation layer 140 having the drain contact hole 143 by depositing a transparent conductive material and patterning it through a mask process. The pixel electrode 150 contacts the drain electrode 136 through the drain contact hole 143. For example, the transparent conductive material may be indium tin oxide (ITO) or indium zinc oxide (IZO).

Accordingly, the array substrate according to the first embodiment of the present invention is completed.

In the array substrate according to the first embodiment of the present invention, since the barrier layer 120 of the almost inoxidizable metallic material is formed on the source and drain areas 106b of the oxide semiconductor layer 106, oxygen is prevented from being provided from the inter insulating layer 125 to the source and drain areas 106b of the oxide semiconductor layer 106. Thus, it is prevented that the conductive properties of the source and drain areas 106b decrease as time passes.

FIGS. 5A to 5E are cross-sectional views of illustrating an array substrate in steps of a method of fabricating the same according to a second embodiment of the invention and show a pixel region including an oxide thin film transistor as a switching element. The method according to the second embodiment is substantially the same as the first embodiment except for formation of source and drain areas of an oxide semiconductor layer. Explanation for the same parts may be omitted.

Figure 5A:
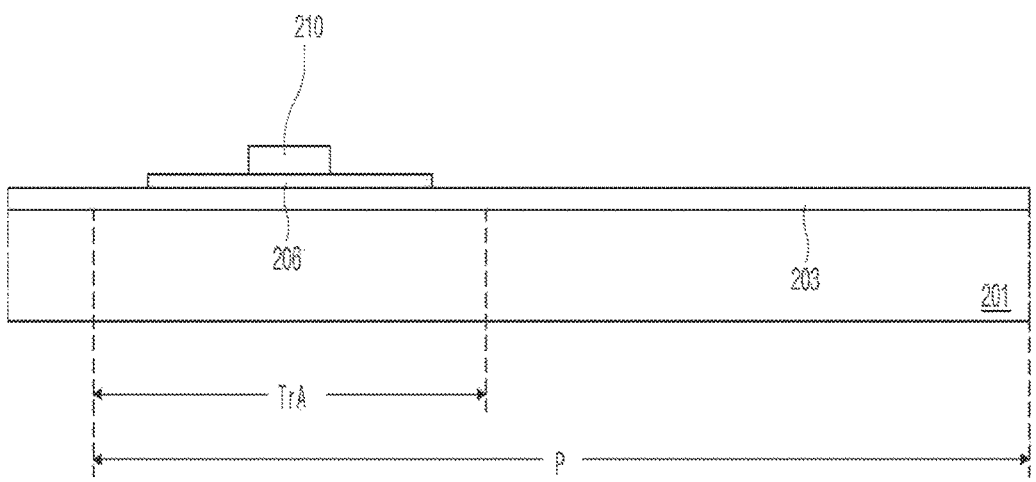
FIGS. 5A to 5E are cross-sectional views of illustrating an array substrate in steps of a method of fabricating the same according to a second embodiment of the invention and show a pixel region including an oxide thin film transistor as a switching element.

In FIG. 5A, a buffer layer 203 is formed on a transparent insulating substrate 201 by depositing an inorganic insulating material, for example, silicon nitride. The substrate 201 may include glass or plastic.

Then, an oxide semiconductor material layer (not shown) is formed on the buffer layer 203 by depositing an oxide semiconductor material over substantially an entire surface of the substrate 201, and the oxide semiconductor material layer is patterned through a mask process, thereby forming an oxide semiconductor layer 206 having an island shape in the switching region TrA. The oxide semiconductor material may be one of indium gallium zinc oxide (IGZO), zinc tin oxide (ZTO) and zinc indium oxide (ZIO).

Next, a gate insulating material layer (not shown) is formed on the oxide semiconductor layer 206 by depositing an inorganic insulating material such as silicon oxide or silicon nitride over an entire surface of the substrate 201, and the gate insulating material layer is patterned through a mask process, thereby forming a gate insulating layer 210 having an island shape and corresponding to a central portion of the oxide semiconductor layer 206.

Here, the gate insulating layer 210 may be formed to correspond to only the central portion of the oxide semiconductor layer 206. Alternatively, the gate insulating layer 210 may be further formed to correspond to a gate line, which will be formed later.

Figure 5B:
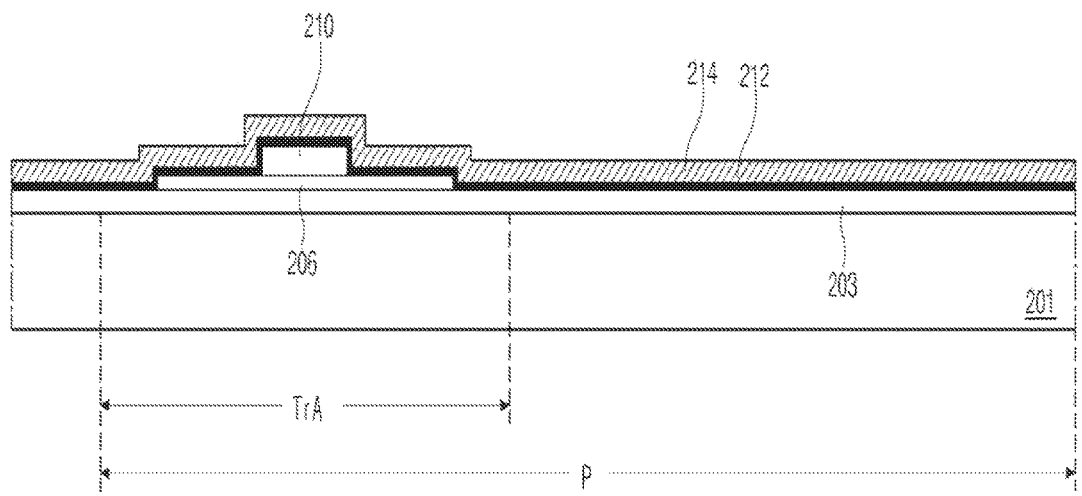

Next, in FIG. 5B, a reactive metallic layer 212 and a first metallic layer 214 are sequentially formed on the gate insulating layer 210 by depositing a reactive metallic material reacting with the material of the oxide semiconductor layer 206 and a metallic material having relatively low resistivity over an entire surface of the substrate 201. The reactive metallic material and the oxide semiconductor material may be counter diffused into each other when heat is applied. The reactive metallic material may include titanium (Ti) or tantalum (Ta). The reactive metallic layer 212 may have a thickness of several angstroms to dozen angstroms. The first metallic layer 214 may include one or more than two selected from aluminum (Al), aluminum alloy such as AlNd, copper (Cu), copper alloy, molybdenum (Mo), and molybdenum alloy such as MoTi.

Figure 5C:
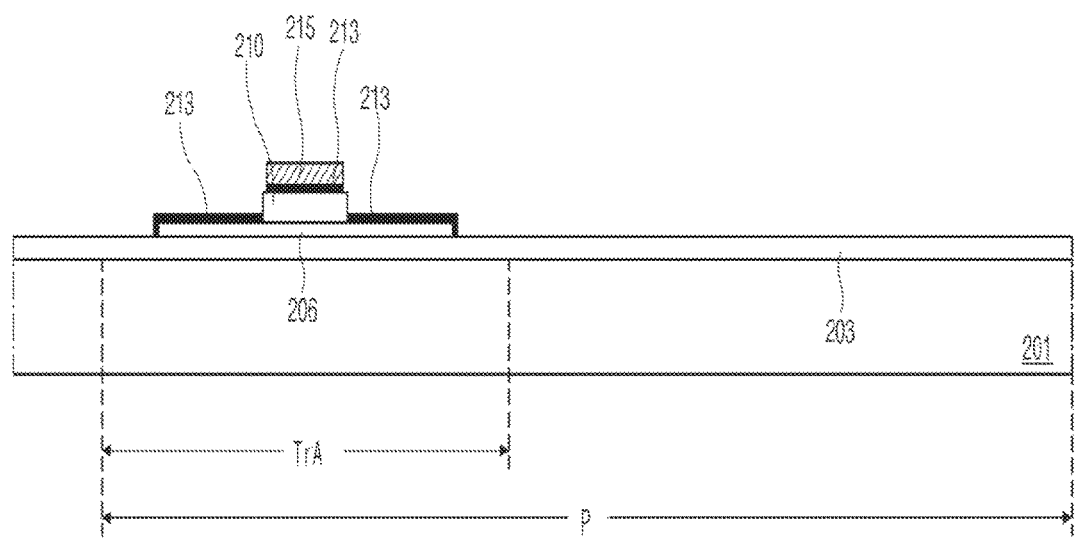

Then, in FIG. 5C, a reactive metallic pattern 213 and a gate electrode 215 are formed in the switching region TrA by patterning the first metallic layer 214 and the reactive metallic layer 212 through a mask process. A portion of the reactive metallic pattern 213 is formed on the oxide semiconductor layer 206 exposed outside the gate electrode 215, and another portion the reactive metallic pattern 213 is formed between the gate electrode 215 and the gate insulating layer 210. Meanwhile, a gate line (not shown) is also formed on the buffer layer 203 or on the gate insulating layer 210 on the buffer layer 203. The gate line is connected to the gate electrode 215, and the reactive metallic pattern 213 is formed under the gate line.

When the reactive metallic layer 212 of FIG. 5B contacts the oxide semiconductor layer, the reactive metallic layer 212 of FIG. 5B formed of the reactive metallic material reacts with the oxide semiconductor layer 106, and an oxide layer of the reactive metallic material is generated at an interface therebetween. The oxide layer of the reactive metallic material is not completely removed when the first metallic layer 214 of FIG. 5B is patterned to form the gate electrode 215, and remains on the oxide semiconductor layer 206 to become the reactive metallic pattern 213 corresponding to the oxide semiconductor layer 206 exposed outside the gate insulating layer 110.

Figure 5D:
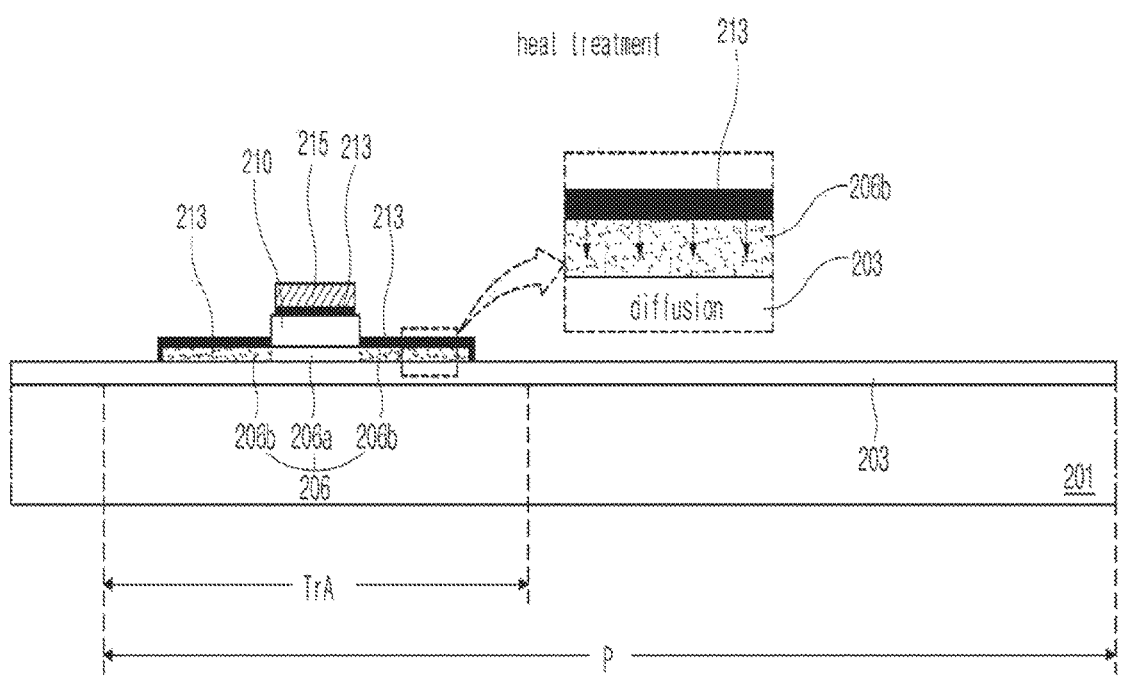

Next, in FIG. 5D, a heat treatment process is performed to the substrate 201 including the gate line (not shown), the gate electrode 215 and the reactive metallic pattern 213. At this time, molecules are diffused at an interface between the reactive metallic pattern 213 and the oxide semiconductor layer 206 directly contacting the reactive metallic pattern 213 through the heat treatment process. Therefore, the molecules of the reactive metallic pattern 213 are partially diffused into the oxide semiconductor layer 206, and exposed portions of the oxide semiconductor layer 206 have the improved conductive properties and become source and drain areas 206*b*.

The molecules of the reactive metallic pattern 213 are not diffused into a portion of the oxide semiconductor layer 206 overlapping the gate insulating layer 210, and the portion of the oxide semiconductor layer 206 overlapping the gate insulating layer 210 becomes an active area 203.

Figure 5E:
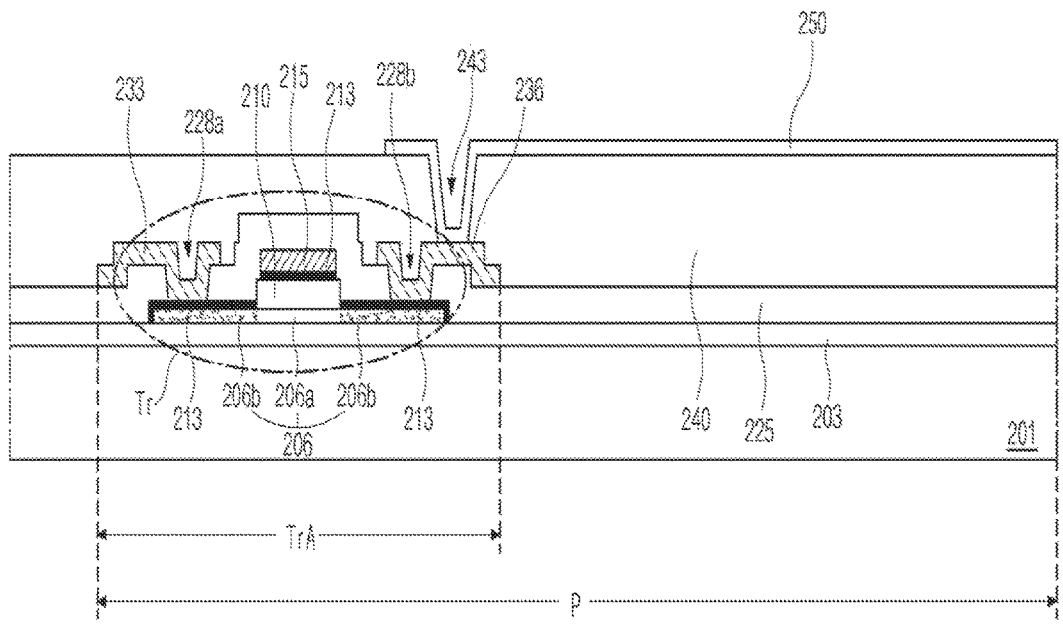

In the second embodiment, since the molecules of the metallic material are diffused into the oxide semiconductor layer 206 to form the source and drain areas 206*b*, the conductive properties of the source and drain areas 206*b* are not decreased even if oxygen is supplied from an inter insulating layer 225 of FIG. 5E to the source and drain areas 206*b*.

Moreover, the reactive metallic pattern 213 is formed on the source and drain areas 206*b* and function as the barrier layer of the first embodiment that blocks oxygen from the inter insulating layer 225 of FIG. 5E. Thus, it is further prevented that the conductive properties of the source and drain areas 206*b* decrease as time passes.

Next, in FIG. 5E, the same steps as those mentioned in the first embodiment are performed to thereby form an inter insulating layer 225 having first and second semiconductor contact holes 228*a* and 228*b* that expose the reactive metallic pattern 213 on the source and drain areas 206*b*, respectively, a data line (not shown), source and drain electrodes 233 and 236 that contact the reactive metallic pattern 213 through the first and second semiconductor contact holes 228*a* and 228*b*, respectively, a passivation layer 240 having a drain contact hole 243 that exposes the drain electrode 236, and a pixel electrode 250 contacting the drain electrode 236 through the drain contact hole 243. Accordingly, the array substrate according to the second embodiment of the present invention is completed.

In the array substrate according to the second embodiment of the present invention, it is prevented that the conductive properties of the source and drain areas 206*b* of the oxide semiconductor layer 206 decrease as time passes.

Figure 6A:
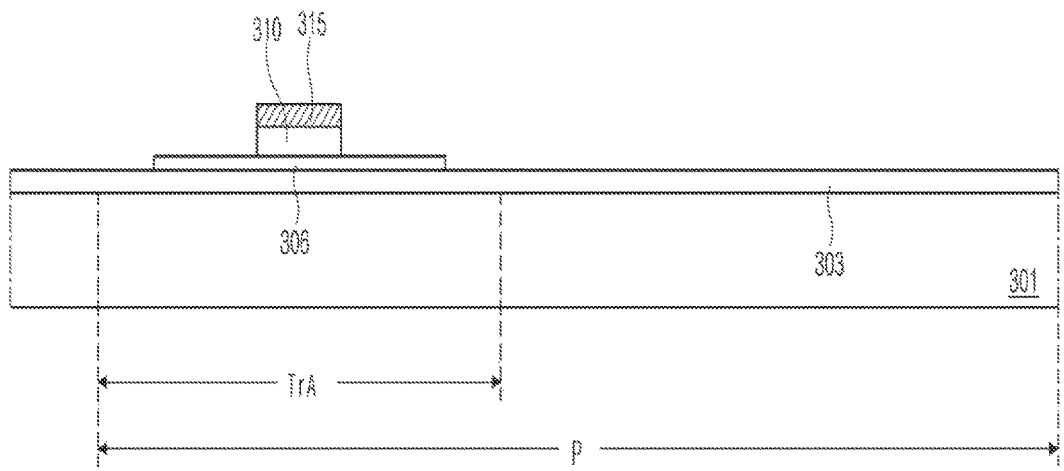
FIGS. 6A to 6C are cross-sectional views of illustrating an array substrate in steps of a method of fabricating the same according to a third embodiment of the invention and show a pixel region including an oxide thin film transistor as a switching element.
Figure 6B:
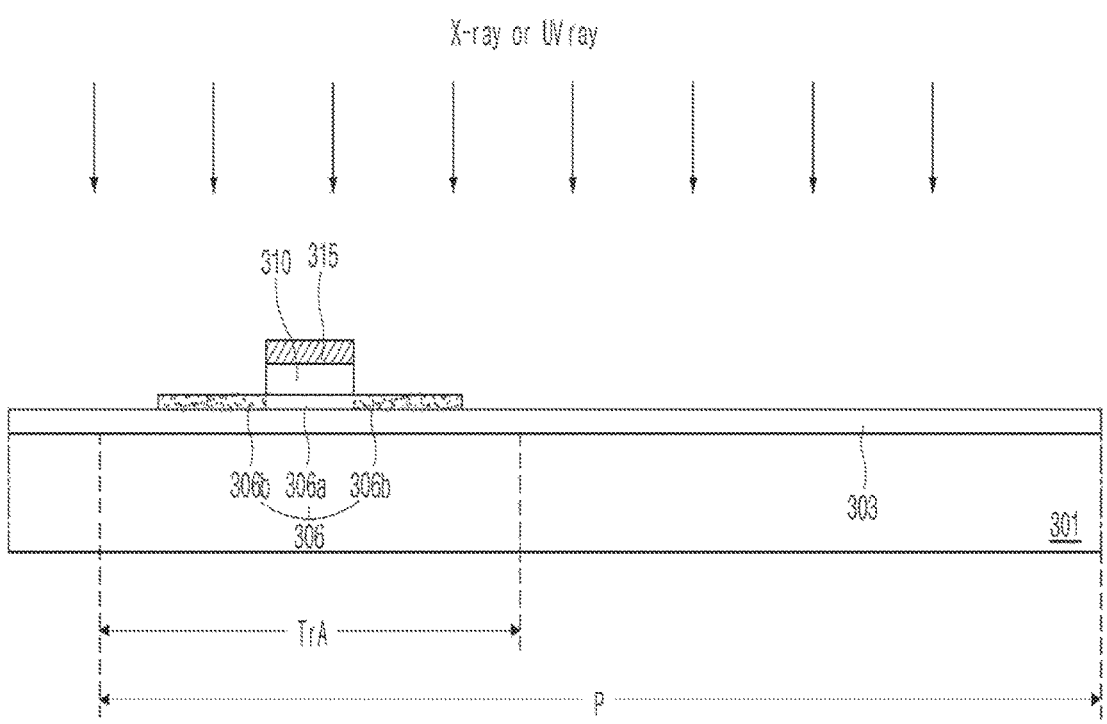
Figure 6C:
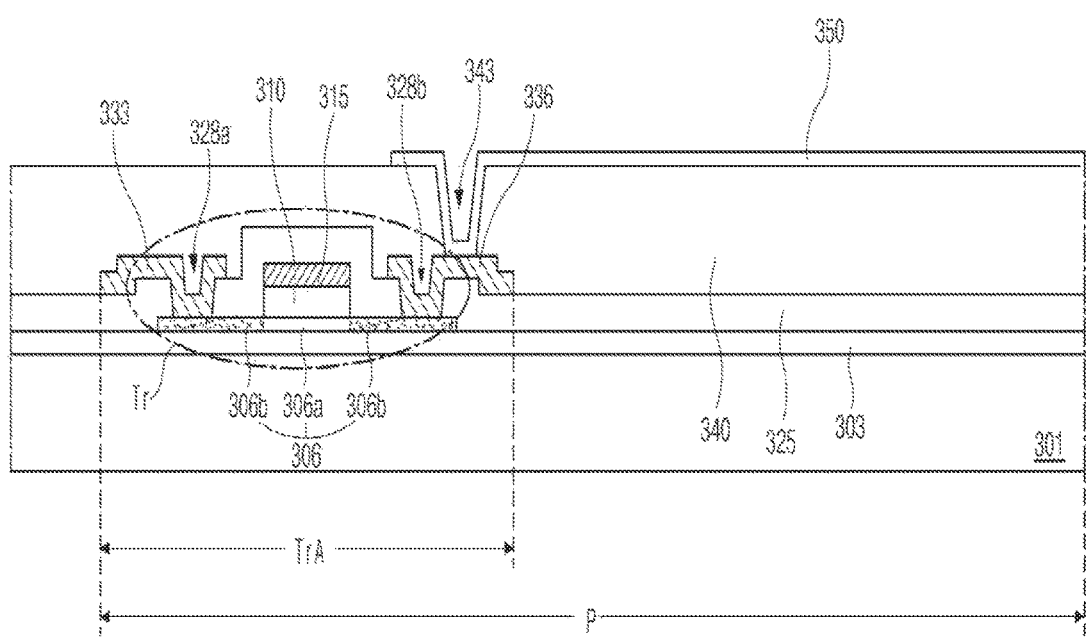

FIGS. 6A to 6C are cross-sectional views of illustrating an array substrate in steps of a method of fabricating the same according to a third embodiment of the invention and show a pixel region including an oxide thin film transistor as a switching element. The method according to the third embodiment is substantially the same as the first embodiment except for formation of source and drain areas of an oxide semiconductor layer. Explanation for the same parts may be omitted.

In FIG. 6A, a buffer layer 303 is formed on an entire surface of a substrate 301 by performing the same step as the first embodiment, and an oxide semiconductor layer 306, a gate insulating layer 310 and a gate electrode 315 are formed on the buffer layer 303 in the switching region TrA. The gate insulating layer 310 and the gate electrode 315 correspond to a central portion of the oxide semiconductor layer 306. In addition, a gate line (not shown) connected to the gate electrode 315 is formed on the buffer layer 303, and the gate insulating layer 310 is formed under the gate line.

Next, in FIG. 6B, short-wavelength rays such as X-rays or UV rays having a predetermined energy density are irradiated to the oxide semiconductor layer 306 exposed outside the gate insulating layer 310, thereby increasing the conductive properties of the oxide semiconductor layer 306 exposed to the X-rays or UV rays. The X-rays or UV rays are reflected by the gate electrode 315 and do not reach a portion of the oxide semiconductor layer 306 overlapping the gate electrode 315.

When the X-rays or UV rays having the predetermined energy density are irradiated to the oxide semiconductor layer 306 exposed outside the gate insulating layer 310, the oxide semiconductor material reacts with the X-rays or UV rays. That is, a polymer chain combined with oxygen is disconnected by the X-rays or UV rays, and the oxygen is released outside. The disconnected polymer chain cannot accept oxygen even if oxygen is supplied again.

In the third embodiment, the source and drain areas 306*b* of the oxide semiconductor layer 306 have the improved conductive properties due to irradiation of X-rays or UV rays. Even though the inter insulating layer 325 of silicon oxide is formed on the oxide semiconductor layer 306 without a barrier layer, it is prevented that the conductive properties of the source and drain areas 306*b* of the oxide semiconductor layer 306 decrease as time passes.

Next, in FIG. 6C, the same steps as those mentioned in the first embodiment are performed to thereby form an inter insulating layer 325 having first and second semiconductor contact holes 328*a* and 328*b* that expose the source and drain areas 306*b*, respectively, a data line (not shown), source and drain electrodes 333 and 336 that contact the source and drain areas 306*b* through the first and second semiconductor contact holes 328*a* and 328*b*, respectively, a passivation layer 340 having a drain contact hole 343 that exposes the drain electrode 336, and a pixel electrode 350 contacting the drain electrode 336 through the drain contact hole 343. Accordingly, the array substrate according to the third embodiment of the present invention is completed.

In the array substrate according to the third embodiment of the present invention, the conductive properties of the source and drain areas 306b of the oxide semiconductor layer 306 are improved by irradiation of X-rays or UV rays, and it is prevented that the conductive properties of the source and drain areas 306b of the oxide semiconductor layer 306 decrease as time passes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising:
   forming a buffer layer on a substrate;
   forming an oxide semiconductor layer on the buffer layer;
   sequentially forming a gate insulating layer on the oxide semiconductor layer and a gate electrode on the gate insulating layer, wherein the gate insulating layer and the oxide semiconductor layer correspond to a central portion of the oxide semiconductor layer, and the gate insulating layer and the gate electrode have a same width;
   irradiating X-rays or UV rays to a first portion of the oxide semiconductor layer to form a source area and a second portion of the oxide semiconductor layer to form a drain area, wherein the first and second portions of the oxide semiconductor layer are exposed outside the gate electrode and on opposite sides of the gate electrode, wherein the X-rays or UV rays increase conductive properties of the oxide semiconductor layer in the first and second portions to be more conductive than a third portion of the oxide semiconductor layer that overlaps with the gate electrode;
   forming an inter insulating layer on the gate electrode and having first contact holes that expose the source and drain areas;
   forming source and drain electrodes on the inter insulating layer and contacting the source and drain areas through the first contact holes, respectively;
   forming a passivation layer on the source and drain electrodes and having a second contact hole exposing the drain electrode; and
   forming a pixel electrode on the passivation layer and contacting the drain electrode through the second contact hole in the passivation layer,
   wherein the oxide semiconductor layer includes indium gallium zinc oxide,
   wherein an upper surface of the passivation layer contacts a bottom surface of the pixel electrode and lower surfaces of the passivation layer contact upper surfaces of the inter insulating layer and the source and drain electrodes, and
   wherein an upper surface of the gate electrode contacts the passivation layer and a lower surface of the gate electrode contacts the gate insulating layer.

2. The method according to claim 1, wherein forming the source and drain areas includes disconnecting a polymer chain combined with oxygen and releasing the oxygen outside.

3. The method according to claim 1, wherein a width of the gate electrode is smaller than a width of the source area and a width of the drain area.

4. The method according to claim 2, wherein the disconnected polymer chain in the source and drain areas cannot accept oxygen even if oxygen is supplied again.

* * * * *